(12) United States Patent
Li et al.

(10) Patent No.: US 7,938,936 B2
(45) Date of Patent: May 10, 2011

(54) ORGANIC ELECTRO-LUMINESCENCE DEVICE

(75) Inventors: Shi-Hao Li, Panchiao (TW);
Chung-Yeh Iou, Taichung Hsien (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/430,324

(22) Filed: Apr. 27, 2009

(65) Prior Publication Data
US 2009/0206747 A1 Aug. 20, 2009

Related U.S. Application Data

(63) Continuation of application No. 11/315,172, filed on Dec. 23, 2005, now abandoned.

(30) Foreign Application Priority Data

Mar. 25, 2005 (TW) .............................. 94109258 A

(51) Int. Cl.
*C23C 14/34* (2006.01)
(52) U.S. Cl. ................................. 204/192.26; 427/248.1
(58) Field of Classification Search ............. 204/192.26, 204/192.27, 192.28; 427/248.1
See application file for complete search history.

(56) References Cited

U.S. PATENT DOCUMENTS

| | | | | |
|---|---|---|---|---|
| 6,121,727 | A * | 9/2000 | Kanai et al. ................... | 313/504 |
| 6,137,223 | A | 10/2000 | Hung et al. | |
| 6,420,031 | B1 | 7/2002 | Parthasarathy | |
| 6,528,188 | B1 * | 3/2003 | Suzuki et al. ................. | 428/690 |
| 6,579,629 | B1 | 6/2003 | Raychaudhuri | |
| 6,639,357 | B1 * | 10/2003 | Parthasarathy et al. ....... | 313/504 |
| 6,703,180 | B1 * | 3/2004 | Boroson et al. ............... | 430/200 |
| 6,797,129 | B2 | 9/2004 | Raychaudhuri | |
| 6,991,858 | B2 * | 1/2006 | Lee et al. ...................... | 428/690 |
| 7,622,200 | B2 * | 11/2009 | Ohsawa et al. ............... | 428/690 |
| 2003/0129447 | A1 | 7/2003 | Madathil et al. | |
| 2004/0127710 | A1 | 7/2004 | Park et al. | |

(Continued)

FOREIGN PATENT DOCUMENTS

CN 1338784 3/2002

(Continued)

OTHER PUBLICATIONS

Li, et al.; "Enhanced Brightness and Efficiency in Organic Light-Emitting Devices Using an LiF-Doped Electron-injecting Layer with Aluminum Cathode;" Chinese Phys. Lett.; IOP Journals, vol. 18, No. 1, pp. 120-122, Jan. 2001.

(Continued)

*Primary Examiner* — Rodney G McDonald
(74) *Attorney, Agent, or Firm* — Thomas, Kayden, Horstemeyer & Risley, LLP

(57) ABSTRACT

A method of fabricating an organic electro-luminescence device comprising the steps of providing a substrate, an organic chamber, and a sputtering chamber, forming a hole injection layer on the substrate, forming a hole transport layer on the hole injection layer in the organic chamber, forming a light-emitting layer on the hole transport layer in the organic chamber, disposing a metal chelate material on the light-emitting layer and partially doping a CsF compound into the metal chelate material to forming an electron transporting layer in the organic chamber, forming a buffer layer on the electron transporting layer in the organic chamber, transferring the substrate, the hole injection layer, the hole transport layer, light-emitting layer, the electron transporting layer, and the buffer layer form the organic chamber to the sputtering chamber, and forming an electron injection layer on the buffer layer in the sputtering chamber.

8 Claims, 2 Drawing Sheets

U.S. PATENT DOCUMENTS

2005/0174047 A1  8/2005  Shin
2006/0115673 A1  6/2006  Li

FOREIGN PATENT DOCUMENTS

EP  0 880 307 A2 *  11/1998
EP  0 982 783 A2 *  3/2000

OTHER PUBLICATIONS

Li, et al.; Non-Final Office Action mailed Aug. 20, 2008, filing date Dec. 23, 2005, U.S. Appl. No. 11/315,172.

Li, et al.; Final Office Action mailed Feb. 2, 2009, filing date Dec. 23, 2005, U.S. Appl. No. 11/315,172.

* cited by examiner

ORGANIC ELECTRO-LUMINESCENCE DEVICE

CROSS-REFERENCE TO RELATED APPLICATIONS

This application is a continuation of U.S. patent application Ser. No. 11/315,172, filed Dec. 23, 2005 now abandoned.

BACKGROUND OF THE INVENTION (1) Field of the Invention

The present invention relates generally to organic electro-luminescence devices (OLEDs) and particularly to a top-emission organic electro-luminescence device.

(2) Description of the Prior Art

Organic electro-luminescence devices become popular in display technology these days. Comparing to another popular display—liquid crystal display (LCD), the organic electro-luminescence devices have the advantage of self light-emitting. Hence, backlight module is no more needed in a panel display applied OLEDs.

Please refer to FIG. 1, which is a cross-section view of the structure of an organic electro-luminescence device. The electro-luminescence device 100 comprises, in the sequence from bottom to top, a substrate 102, a hole injection layer 104, a hole transport layer 110, a light-emitting layer 120, an electron transporting layer 140, and an electron injection layer 150. Wherein the hole transport layer 110, the light-emitting layer 120, and the electron transporting layer 140 are made of organic materials and fabricated via organic processes.

Combination of electron and hole in the light-emitting layer 120 would release photons. In the process, electrical energy is converted to optical energy. As shown in FIG. 1, the generated light leaves the electro-luminescence device 100 through its bottom (the substrate 102). So the electro-luminescence device 100 is also named as an "bottom-emission type". Wherein, the hole injection layer 104 is usually made of ITO material, which is know as a light-transparent material. The electron injection layer 150 is made of light-reflecting metal materials with low work function, for instance, Al, Ca, Mg, and Ag are well suited. The light-reflecting character of above materials forces the generated light leave the organic electro-luminescence device 100 via the substrate 102.

However, some essential wires are disposed on the substrate 102. As to an active-matrix organic light emitting display (AM OLED), it even needs thin film transistors (TFTs) array on the substrate 102. Said wires or TFTs would restrict the light utilizing efficiency because of a limited aperture ratio.

Please refer to FIG. 2. A prior "top-emission type" organic electro-luminescence device 100a is presented. Wherein, the generated light leaves the organic electro-luminescence device 100a via the electron injection layer 150. In this case, the electron injection layer 150 should be made of light transparent materials, usually ITO, which is also conductive. Because the needed wires or TFTs are made on the substrate 102, no aperture ratio issue should be concerned in the top-emission type organic electro-luminescence device 100a. Comparing to the organic electro-luminescence device 100 of FIG. 1, the organic electro-luminescence device 100a could provide a better light utilizing efficiency.

While applying conductive transparent material like ITO for the electron injection layer 150, a major issue is that sputtering process of the ITO material would damage the organic materials (140) beneath. Please refer to FIG. 2, a buffer layer 145 made of CuPc is therefore provided by G. Parthasaraty et al. Before forming the electron injection layer 150, the buffer 145 is formed firstly to withstand the sputtering process. However, while practical estimated, the electron injection efficiency of the organic electro-luminescence device 100a is too poor to apply in commercial application. An experiment data shows that the organic electro-luminescence device 100a according to G. Parthasaraty et al. has an electron injection efficiency of 3.7 mA/cm$^2$ with a working voltage at 6 V, mean while, the energy efficiency is less than 1 lm/W.

Please refer to FIG. 3. Another prior organic electro-luminescence device 100b provided by Hung Liang-sun et al. is presented. Before sputtering the buffer layer 145, a LiF/AL interface layer 143 [thickness of AL is about 10~20 A], which is a thin metal layer, is sputtered firstly. Wherein, the buffer layer 145 still comprises CuPc compound. Diffusion of Li from the LiF/AL interface layer 143 to the underneath organic materials (140) could lower the energy barrier of Al chelate in the electron transporting layer 140. From this view, Hung Liang-sun et al. seems have been solved the problem of the organic electro-luminescence device 100a taught by G. Parthasaraty et al.

However, please still refer to FIG. 3, Li of the LiF/AL interface layer 143 could further diffuse into the light-emitting layer 120. This may decrease the life time of the organic electro-luminescence device. Furthermore, the light-emitting layer 120, the electron transporting layer 140, and the buffer layer 145 is fabricated in organic chamber, but the LiF/AL interface layer 143 is fabricated in a metal chamber. Hence the fabrication process of the organic electro-luminescence device 100b comprises moving to the metal chamber after forming the light-emitting layer 120 and the electron transporting layer 140 in a organic chamber, then moving to a organic chamber, finally moving to a sputtering chamber to from the electron injection layer 150. The complicated process (at least three times of movement between different chambers) is a disadvantage of organic electro-luminescence device 100b.

Therefore, how to provide a top-emission organic electro-luminescence device, which overcomes the mentioned problems—the damage of sputtering process, the low electron injection efficiency, the decreased life time of organic materials and the complicated fabrication process, is the major issue of the present invention.

SUMMARY OF THE INVENTION

It is an object of the present invention to provide an organic electro-luminescence device with high electron injection efficiency.

It is another object of the present invention to solve the prior disadvantage of decreased life time of organic materials.

It is another object of the present invention to provide a method for fabricating an organic electro-luminescence device without complicated process.

The present invention relates to an organic electro-luminescence device including a substrate, a hole injection layer disposed on the substrate, an organic layer disposed on the hole injection layer, a buffer layer disposed on the organic layer, and an electron injection layer forming above the buffer layer. The buffer layer is needed for protecting the organic layer while the electron injection layer is being formed. Within, the organic layer at least includes a light-emitting layer, and an electron transporting layer disposed on the light-emitting layer. The electron transporting layer at least includes cesium fluoride to lower an energy barrier.

These and other objectives of the present invention will no doubt become obvious to those of ordinary skill in the art after reading the following detailed description of the preferred embodiment which is illustrated in the various figures and drawings.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention aims at providing an organic electro-luminescence devices and particularly to a top-emission organic electro-luminescence device, which has high current injection efficiency, relatively loner life time, and can be fabricated with relatively simplified processes.

Figure 1:
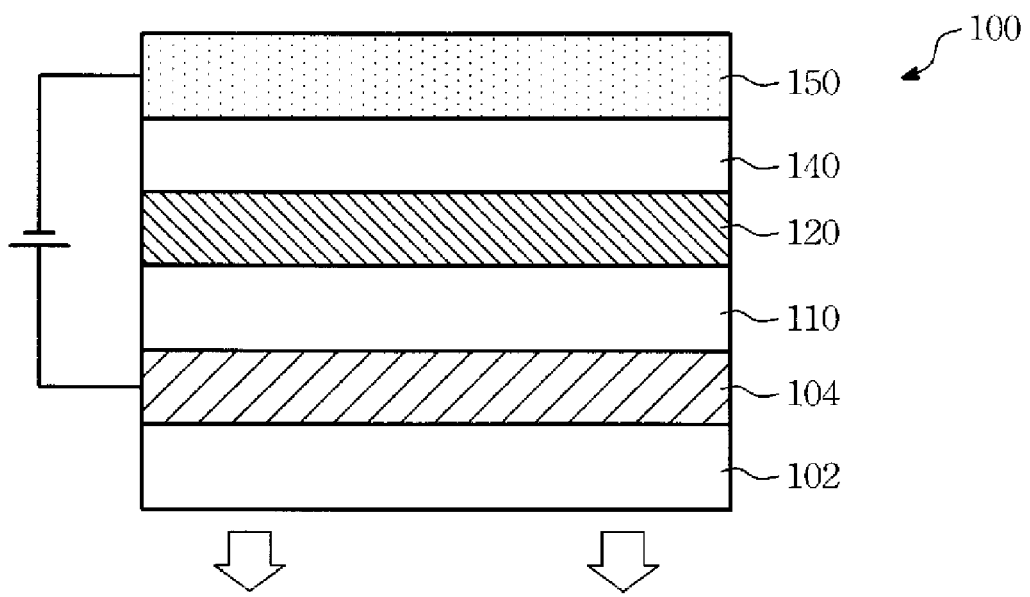
FIG. 1 shows a cross section view of an bottom-emission type organic electro-luminescence device in accordance with a prior art.
Figure 2:
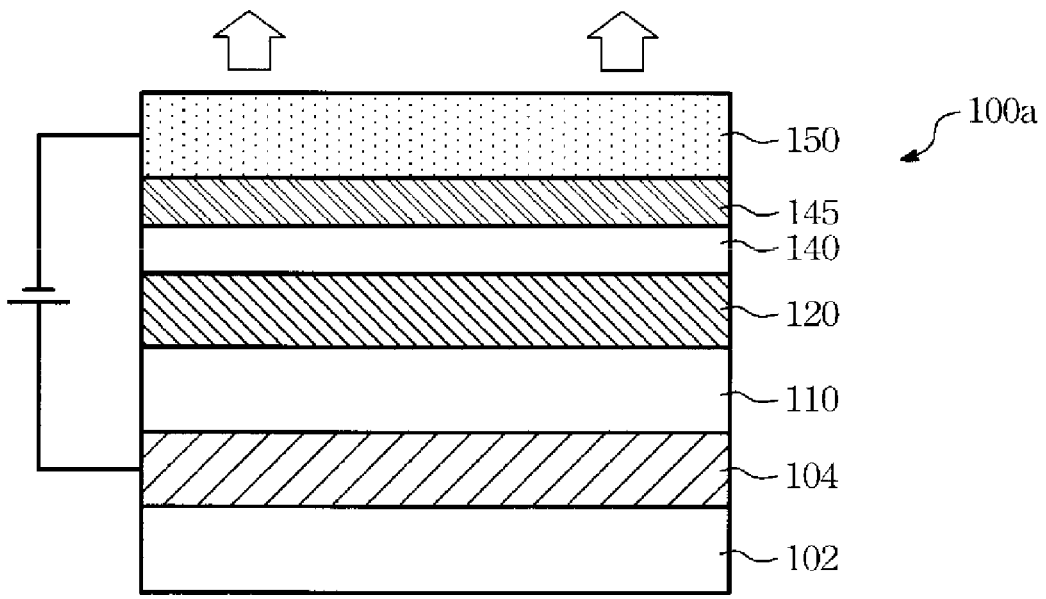
FIG. 2 shows a cross section view of a top-emission type organic electro-luminescence device in accordance with a prior art.
Figure 3:
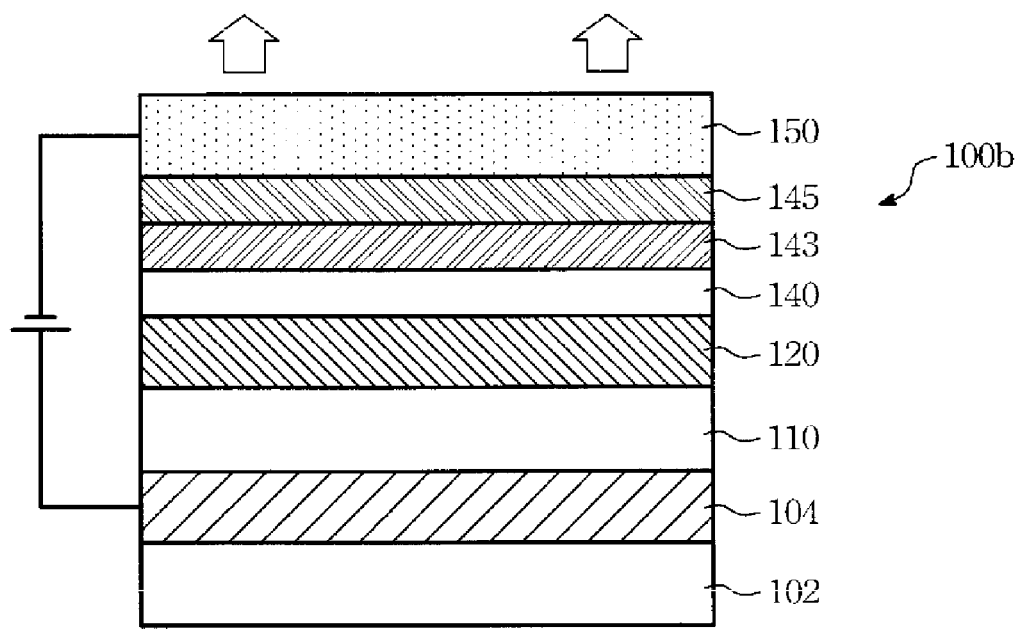
FIG. 3 shows another cross section view of a top-emission type organic electro-luminescence device in accordance with another prior art.
Figure 4:
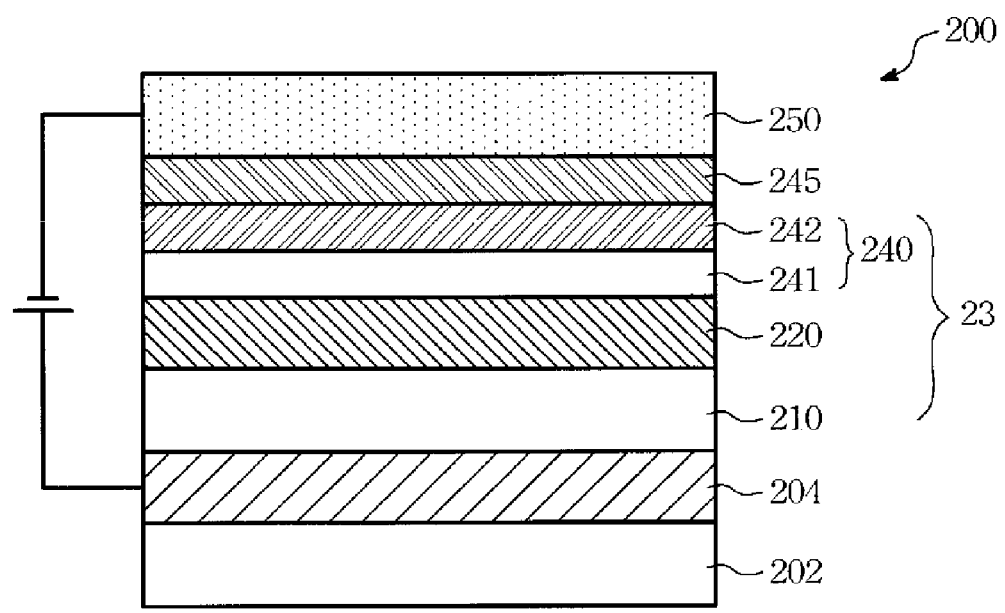
FIG. 4 shows a cross section view of the organic electro-luminescence device of the present invention.

Please refer to FIG. 4, which is a cross section view of an organic electro-luminescence device of the present invention. While fabricating the organic electro-luminescence device 200, a substrate 202 is provided first, then a hole injection layer 204 is disposed on the substrate 202. In one embodiment, the substrate 202 is made of light transparent materials or opaque materials with light reflection character. The hole injection layer 204 is made of conductive transparent materials (for instance, ITO, IZO) via sputtering process.

Next, an organic layer 23 is disposed on the hole injection layer 204. Wherein the organic layer 23 is an multi-layer structure. It at least comprises a light-emitting layer 220 and a electron transporting layer 240. The electron transporting layer 240 is disposed on the light-emitting layer 220. The electron transporting layer 240 includes Cesium fluoride. The organic layer 23 further comprises a hole transport layer 210 between the light-emitting layer 220 and the hole injection layer 204.

The material of the light-emitting layer 220 is selected from the group of fluorescent dyes, phosphorous dyes, or chelate materials. For instance, materials selected from the group of Alq3、NPB、CuPc、C545T、DCJTB、CBP、Balq、Ir(ppy)3 are applied in separated embodiments of the present invention. The method for forming the light-emitting layer 220 is select from vacuum sputtering, plasma polymerization, vacuum evaporating, spin coating, dip coating, Langmuir-Blodgett Film tech., Sol-Gel tech., electrolytic polymerization.

Afterwards, the electron transporting layer 240 is disposed on the light-emitting layer 220. The method of fabricating the electron transporting layer 240 comprises the following steps, in sequence: (1) disposing a metal chelate material above the light source 220 and (2) doping a CsF compound into the metal chelate material. Wherein the metal chelate material is an aluminum chelate (Alq3), and the doping process is via thermal evaporation.

The doping process of CsF is an partially doping process. Only the top portion of the electron transporting layer 240 is doped with CsF. The other portion of the electron transporting layer 240 is un-doped. So the electron transporting layer 240 is a double-layer structure. In FIG. 4, the electron transporting layer 240 comprises a first electron transporting layer 241 and a second electron transporting layer 242. The second electron transporting layer 242 is positioned above the first electron transporting layer 241. The second electron transporting layer 242 comprises the CsF compound and the metal chelate material. The first electron transporting layer 241 comprises the metal chelate material, for instance, the aluminum chelate.

A buffer layer 245 is disposed on the organic layer 23. Wherein, the buffer layer 245 includes a phthalocyanine-based organic compound, for instance, phthalocyanine-Cu complex. All the above processes (from forming the organic layer 23 to the forming of the buffer layer 245) is able to be accomplished in an organic chamber. Even the forming process of the electron transporting layer 240 is accomplished in the same organic chamber. Hence, no chamber-transferring is needed during these processes.

Lastly, the electron injection layer 250 is disposed on the buffer layer 245. The electron injection layer 250 is made of conductive transparent materials, such as ITO or IZO, via a high energy sputtering process. One function of the buffer layer 245 is to protect the underneath layers from the damage aroused from the high energy sputtering process.

According to the above description, the present fabrication method of the organic electro-luminescence device 200 is much simpler than the mentioned prior arts. According to the teaching of Hung Liang-sun et al., three times of chamber transferring are needed after forming the light-emitting layer (organic chamber→metal chamber→organic chamber→sputtering chamber). But the processes of the present invention are able to be accomplished in the organic chamber from the forming process of the light-emitting layer 120 to the forming process of the buffer layer 245. Only one chamber transferring is needed at the forming process of the electron injection layer 250, which is in the sputtering chamber. Hence, the drawback of complicated process of mentioned prior arts is removed.

An experimental data via the present invention shows that the organic electro-luminescence device 200 has an electron injection efficiency of 52 mA/cm2 with a working voltage at 6V. Obviously, the efficiency is much better than the mentioned prior arts according to G. Parthasaraty et al. and Hung Liang-sun et al. Mean while, the energy efficiency of the present invention is about 11.6 lm/W, which also overcomes the mentioned prior arts (1 lm/W for G. Parthasaraty et al. and 9 lm/W for Hung Liang-sun et al.).

Furthermore, the life time of the organic electro-luminescence device 200 is longer than 1500 hours with a brightness of 2000 nits. Clearly, the disadvantage of decreased life time due by diffusion of Li is improved in the present invention. The present organic electro-luminescence device has a relatively longer life time.

As can be understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the present invention has been particularly shown and described with reference to a preferred embodiment, it will be understood by those skilled in the art that various changes in form and detail may be without departing from the spirit and scope of the present invention.

We claim:

1. A method of fabricating an organic electro-luminescence device comprising the following steps:
   providing a substrate, an organic chamber, and a sputtering chamber;
   forming a hole injection layer on the substrate;
   forming a hole transport layer on the hole injection layer in the organic chamber;
   forming a light-emitting layer on the hole transport layer in the organic chamber;
   disposing aluminum chelate (Alq3) on the light-emitting layer and partially doping a CsF compound into the aluminum chelate (Alq3) to form an electron transporting layer in the organic chamber, wherein only a top portion of the electron transporting layer is doped with the CsF compound, and the other portion of the electron transporting layer is un-doped;
   forming a buffer layer on the electron transporting layer in the organic chamber;
   transferring the substrate, the hole injection layer, the hole transport layer, light-emitting layer, the electron transporting layer, and the buffer layer from the organic chamber to the sputtering chamber; and
   forming an electron injection layer on the buffer layer in the sputtering chamber.

2. The method of fabricating an organic electro-luminescence device according to claim 1, wherein the step of forming the hole injection layer on the substrate is performed by a sputtering process.

3. The method of fabricating an organic electro-luminescence device according to claim 1, wherein the step of forming the light-emitting layer is performed by a process selected from the group of vacuum sputtering, plasma polymerization, vacuum evaporating, spin coating, dip coating, Langmuir-Blodgett Film technique, Sol-Gel technique, and electrolytic polymerization.

4. The method of fabricating an organic electro-luminescence device according to claim 1, wherein the material of the light-emitting layer is selected from the group of fluorescent dyes, phosphorous dyes, and chelate materials.

5. The method of fabricating an organic electro-luminescence device according to claim 1, wherein the step of partially doping the CsF compound into the aluminum chelate (Alq3) is performed by thermal evaporation.

6. The method of fabricating an organic electro-luminescence device according to claim 1, wherein the buffer layer includes a phthalocyanine-based organic compound.

7. The method of fabricating an organic electro-luminescence device according to claim 1, wherein the electron injection layer is made of conductive transparent materials.

8. The method of fabricating an organic electro-luminescence device according to claim 1, wherein the electron injection layer is made of ITO or IZO.

* * * * *